United States Patent
Ng et al.

(10) Patent No.: US 10,819,349 B2
(45) Date of Patent: Oct. 27, 2020

(54) PARALLEL FRACTIONAL-N PHASE LOCKED LOOP CIRCUIT

(71) Applicant: IHP GmbH—Innovations for High Performance Microelectronics/Leibniz-Institut fur Innovative Mikroelektronik, Frankfurt (Oder) (DE)

(72) Inventors: Herman Jalli Ng, Frankfurt (DE); Dietmar Kissinger, Ulm (DE)

(73) Assignee: IHP GMBH—INNOVATIONS FOR HIGH PERFORMANCE MICROELECTRONICS/LEIBNIZ-INSTITUT FOR INNOVATIVE MIKROELEKTRONIK, Frankfurt (Oder) (DE)

( * ) Notice: Subject to any disclaimer, the term of this patent is extended or adjusted under 35 U.S.C. 154(b) by 0 days.

(21) Appl. No.: 16/558,724

(22) Filed: Sep. 3, 2019

(65) Prior Publication Data
US 2020/0076440 A1   Mar. 5, 2020

(30) Foreign Application Priority Data
Sep. 3, 2018   (EP) .................................. 18192255

(51) Int. Cl.
| H03L 7/087 | (2006.01) |
| H03L 7/081 | (2006.01) |
| H03L 7/23 | (2006.01) |
| H03L 7/197 | (2006.01) |

(52) U.S. Cl.
CPC .............. *H03L 7/087* (2013.01); *H03L 7/081* (2013.01); *H03L 7/1974* (2013.01); *H03L 7/23* (2013.01); *H03L 7/1976* (2013.01)

(58) Field of Classification Search
CPC ........ H03L 7/1976; H03L 7/081; H03L 7/193; H03L 7/23; H03L 7/1974; H03L 7/087; H03L 7/18; H03L 7/191; H03L 7/022; H03L 7/235
See application file for complete search history.

(56) References Cited

U.S. PATENT DOCUMENTS

| 6,147,561 | A * | 11/2000 | Rhee ....................... H03L 7/087 331/12 |
| 8,373,469 | B2 * | 2/2013 | Kim ........................ H03L 7/081 327/148 |
| 10,396,808 | B2 * | 8/2019 | Sun .......................... H03L 7/197 |
| 2010/0259307 | A1 * | 10/2010 | Kondou ................. H03L 7/087 327/157 |

* cited by examiner

*Primary Examiner* — Ryan Johnson
(74) *Attorney, Agent, or Firm* — Ware, Fressola, Maguire & Barber LLP

(57) ABSTRACT

Novel phase locked loop architectures that can overcome the limitation of the maximum operating frequency of the fractional-N phase-locked loop (PLL) for fast-chirp frequency modulated continuous wave (FMCW) radars are suggested. Several phase frequency detector and charge pumps (PFD&CPs) are put in parallel and are operated with reference signals that are generated by using a delay-locked loop (DLL) instead of further increasing the operating frequency of the PFD&CP. The proposed DLL supported parallel PLL architectures enable further speeding up the FMCW chirp as well as improving its linearity and the performance of Range Doppler Radars based on fast-chirp FMCW radar. Methods for operating the parallel fractional N phase locked loop are proposed.

13 Claims, 12 Drawing Sheets

PARALLEL FRACTIONAL-N PHASE LOCKED LOOP CIRCUIT

CROSS-REFERENCE TO RELATED APPLICATION

This application claims priority under 35 USC § 119 to European Patent Application No. 18192255.0 filed on Sep. 3, 2018, which application is hereby incorporated by reference in its entirety.

TECHNICAL FIELD

The present disclosure relates to a phase locked loop (PLL) circuit. The present disclosure also relates to a frequency modulated continuous wave (FMCW) radar sensor utilizing a PLL circuit architecture according to the present disclosure and a method for operating such a PLL circuit.

BACKGROUND OF THE INVENTION

A PLL circuit, or briefly PLL, is a fundamental component of radio, wireless and communication technology which is based on wireless transceivers generating a wide range of frequencies in order to convert the outgoing data for transmission and down-convert the received signals for processing. Similarly, a PLL circuit is an essential component in all radar sensors operating according to the principle of measuring a time of flight of an electromagnetic wave traveling from a transmit to a receive antenna. The reflected electromagnetic wave provides information about a target that has reflected the transmitted electromagnetic wave. Frequency modulated continuous wave (FMCW) radar technique is regarded as state-of-the-art and is widely used in commercial automotive and industrial radar sensors.

FIG. 1 shows a schematic block diagram of a conventional FMCW radar system or radar sensor 100 including a PLL based chirp generator 101, a frequency multiplier 102, a transmitter 103 and a receiver 104. The chirp generator 101 outputs a linear frequency sweep (chirp) which is multiplied by the multiplier 102 to obtain a linear frequency sweep starting at base frequency $f_0$ and linearly increasing over time t with a slope k. Hence, the temporal dependency of the frequency f is described as $$f(t)=f_0+kt \quad \text{(Eq. 1)}$$

The output of the multiplier 102 is amplified in an amplifier 106 which provides a first output signal to a power amplifier 107 feeding a transmit antenna 108 with a transmit signal $s_{TX}(t)$. The transmit antenna 108 transmits an electromagnetic wave symbolized as a wave 109 which is reflected by a target 111 located at a distance $R_0$ from the transmit antenna 108. The reflected electromagnetic wave 112 is received in a receive antenna 113 generating a receive signal $s_{RX}(t)$. The receive signal $s_{RX}(t)$ is down mixed in a down conversion mixer (MX) 114 with a second output signal of amplifier 106 to obtain an intermediate frequency signal $s_{IF}(t)$, which is converted in an analog-to-digital (A/D) converter 116. The output signal of the A/D converter 116 is processed in a signal processing unit 117. The signal processing unit 117 extracts information from the A/D converted intermediate frequency signal $s_{IF}(t)$ and generates output signals that can be used for controlling a vehicle or a display (not shown) for presenting the information in a human intelligible form to an operator to name just two examples.

The reflected electromagnetic wave 112 is received after a delay that corresponds to the time of flight of the electromagnetic wave 109 from the transmit to the receive antenna 108, 113. The time of flight is proportional to the distance $R_0$ of the target 111 from the radar sensor 100. The receive-signal $s_{RX}(t)$ is compared with the transmit signal in the down conversion mixer 114, which outputs a constant frequency course corresponding to a frequency difference between the transmit and the received signal. The frequency course of the receive-signal is in fact a time delayed version of the frequency course of the transmit signal as it will be explained in greater detail further below.

The conventional FMCW radar utilizes slow continuous up chirp and down chirp and is only meant to detect the range of the target 111, i.e. its distance from the radar sensor.

An improved version of the conventional FMCW radar is the so-called fast chirp FMCW radar. The fast chirp FMCW radar typically uses a much faster continuous up chirp and it enables both range and Doppler measurements allowing determining the distance and speed of the target 111. Fast chirp FMCW radar use fractional-N phase-locked loop (PLL) circuits, briefly called fractional-N PLL in the following. For precise measurements the linearity of the chirp signal generated by the fractional-N PLL is of high importance, which increases with an increasing operating frequency of the PLL as it is explained in the following.

In the article "A DLL supported, low phase noise fractional-N PLL with a wideband VCO and a Highly Linear Frequency Ramp Generator for FMCW Radars" by Ng et al. (IEEE Transactions on Circuits and Systems Vol. 60, December 2013, pages 3289 ff.) a fractional-N phase locked loop-based synthesizer is disclosed. A delay locked loop is utilized as frequency multiplier for the reference signal to improve phase noise performance of the PLL and the linearity of the frequency sweep generated by the PLL. However, there is a limit on the frequency multiplication factor for the reference signal due to the limitation on the maximum operating frequency of a phase frequency detector and charge pump of the PLL.

The present disclosure addresses a desire to improve radar sensors enabling them to provide better information about radar targets.

SUMMARY OF THE INVENTION

According to a first aspect the present disclosure suggests a phase locked loop (PLL) circuit comprising a reference signal source and a voltage controlled oscillator for generating a phase and/or frequency controlled output signal. A multi-modulus divider divides the output signal of the voltage controlled oscillator to generate a divider signal that is compared with a reference signal in a phase frequency detector and charge pump (PFD&CP) outputting an error signal that controls the voltage controlled oscillator. The phase locked loop (PLL) circuit is characterized by
  a delay locked loop (DLL) as the reference signal source that provides n reference signals that have the same frequency and are shifted among each other by a fixed phase difference, wherein n is a natural number,
  generator means for generating one associated divider signal for each reference signal,
  n phase frequency detectors and charge pumps (PFDs&CPs) configured such that each one of the reference signals and an associated divider signal are connected as a pair of input signals to one phase frequency detector and charge pump (PFD&CP) outputting an error signal if a frequency and/or phase difference is detected between the input signals; and a node where all error signals generated by the phase frequency detectors and charge pumps (PFDs&CPs) are summed up to generate a control voltage signal for controlling the voltage controlled oscillator.

The control of the voltage controlled oscillator is designed to minimize frequency and/or phase differences between the pairs of associated divider and reference signals.

According to an embodiment the multi-modulus divider is operatively connected with an associated delta sigma modulator to form a fractional-N divider.

Advantageously, the fractional-N divider enables the phase frequency detector to run at a frequency that is higher than the frequency of the reference signals, achieving reduced noise levels.

According to an advantageous embodiment the generator means include a multi-phase splitter receiving the output signal of the multi-modulus divider for generating n divider signals, that are shifted by an equal phase difference relative to one another. The frequency of the dividers signals is n-times smaller than the frequency of the output signal of the multi-modulus divider. The phase difference between individual divider signals is $2\pi/n$.

Advantageously, the output of the multi-modulus divider can be connected to the delta sigma modulator as clock signal. The output of the multi-modulus divider is readily available without requiring any additional circuitry for creating a clock signal.

According to a further embodiment the phase locked loop circuit comprises a pre-scaler receiving the output of the voltage controlled oscillator and outputting a lower frequency signal to the multi-modulus divider.

The pre-scaler is optional and is usually utilized if the multi-modulus divider cannot directly process/divide the output signal of the VCO with a very high-frequency. The pre-scaler is a very high-speed frequency divider and is usually composed of several divide-by-two circuits. It can divide the output signal of the VCO with the highest frequency directly. The output signal of the pre-scaler has a much lower frequency and can be connected directly to the multi-modulus divider.

In an advantageous embodiment the phase locked loop circuit comprises a plurality of multi-modulus dividers and associated delta sigma modulators to form parallel fractional-N dividers. A multi-phase splitter receives the output signal of the voltage controlled oscillator or the pre-scaler and outputs a plurality of phase shifted output signals to each one of the plurality of fractional-N dividers. The parallel fractional-N dividers are useful for outputting a plurality of divider signals allowing processing a plurality of reference signals. This concept enables a more precise phase and/or frequency detection without having to increase the operational frequency of the involved phase and/or frequency detectors.

It has been found useful to provide the output signal of each multi-modulus divider as clock signal to the associated delta sigma modulator forming one of the fractional-N dividers.

Again, using the output of a multi-modulus divider is a convenient way to provide a clock signal since no additional circuitry is required.

In an alternative embodiment each reference signal is provided as clock signal to one of the delta sigma modulators forming one of the fractional-N dividers. Likewise, these signals are readily available as clock signals.

In accordance with an embodiment of the present disclosure a frequency ramper controls the delta sigma modulator. The control voltage ensures that the up chirp and down chirp frequency sweep signals are generated.

Advantageously the multi-phase splitter can receive an input signal from the pre-scaler.

In an advantageous embodiment the output each one of the parallel multi-modulus dividers is connected with a multi-phase splitter outputting a plurality of divider signals. This architecture reduces the number of parallel multi-modulus dividers. If each multi-phase splitter outputs two signals then the required number of parallel and multi-modulus dividers is divided by 2, correspondingly.

In an alternative embodiment the delay locked loop includes a multiplier multiplying the reference signal by a factor n to generate a clock signal to be provided to each one of the delta sigma modulators of the parallel fractional dividers. A clock signal which is based on a reference signal is a relatively "clean" and undistorted signal and may bring about advantages with regard to precise clocking of the delta sigma modulator.

Finally, one embodiment of the present disclosure combines some or all features of the previously mentioned embodiments. In particular, this embodiment comprises a combination of parallel phase frequency detectors and charge pumps (PFDs&CPs), parallel fractional-N dividers, one or multiple multipliers for multiplying a reference signal, one or several multi-phase splitters connected with an output of a fractional-N divider and/or one or several multi-phase splitters providing an input to the one or several fractional-N dividers.

According to a second aspect the present disclosure suggests a radar sensor comprising a phase locked loop circuit in accordance with the first aspect of the present disclosure. The radar sensor offers increased performance of Range Doppler Radars, e.g. distances and velocities can be detected more precisely.

According to a third aspect the present disclosure suggests a method for operating a phase locked loop according to the first aspect of the present disclosure. The method comprises providing n reference signals that have the same frequency and are shifted among each other by a fixed phase difference, wherein n is a natural number, receiving an output signal of a multi-modulus divider and generating n divider signals, that are shifted by an equal phase difference relative to one another, wherein their frequency is n-times smaller than the frequency of the output signal of the multi-modulus divider, and wherein the frequency of the n divider signals corresponds to the frequency of the output signal of the multi-modulus divider divided by n;

connecting each one of the reference signals and an associated divider signal as a pair of input signals to one phase frequency detector and charge pump (PFD&CP);

outputting an error signal if a frequency and/or phase difference is detected between the input signals; and summing up all error signals to control a voltage controlled oscillator such that a potentially existing frequency and/or phase difference between the pairs of input signals is reduced.

BRIEF DESCRIPTION OF THE DRAWINGS

Exemplary embodiments of the present disclosure are illustrated in the drawings and are explained in more detail in the following description. In the figures the same or similar elements are referenced with the same or similar reference signs. It shows:

FIG. 9 a timing diagram of the signals processed in the parallel PFDs&CPs shown in

FIG. 8;

DETAILED DESCRIPTION

Figure 2:
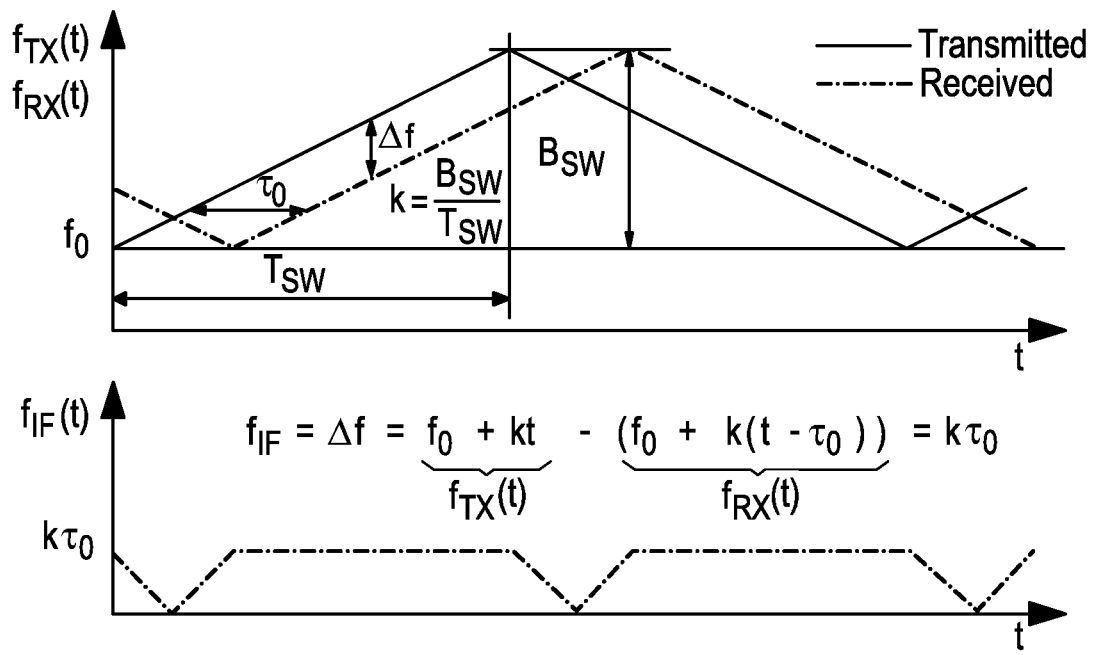
FIG. 2 frequency diagrams of slow continuous up-chirp and down-chirp signal.

FIG. 2 shows in the upper diagram a frequency course of a slow continuous up-chirp and down-chirp of the transmit and receive signal, namely $f_{TX}(t)$ and $f_{RX}(t)$, respectively. The duration of the up chirp and down chirp is equal and indicated as $T_{SW}$. The frequency courses of the transmit and receive signal are shifted by the time of flight $\tau_0$ along the time axis, i.e. the up chirp of the receive signal is delayed by the time of flight $\tau_0$ compared to the up chirp of the transmit signal. The frequency difference at a given point in time when both signals are in their corresponding up chirp phases is indicated as $\Delta f$ and can be calculated according to the formula $$\Delta f = f_0 + kt - (f_0 + k(t-\tau_0)) = k\tau_0 \qquad \text{(Eq. 2)},$$

Wherein k corresponds to the slope of the frequency f(t) that has been introduced in Equation (1).

The frequency of the intermediate signal generated by the mixer 114 equals the frequency difference $\Delta f$ and is shown in the lower diagram in FIG. 2.

The conventional FMCW radar utilizes slow continuous up chirp and down chirp and is only meant to detect the range of the target, i.e. its distance from the radar sensor.

Fast chirp FMCW radar typically uses a much faster continuous up chirp and it enables both range and Doppler measurements. Doppler measurements enable directly determining the speed of the target 111 because the velocity of the target causes a frequency shift of the reflected electromagnetic wave. Thus, fast chirp FMCW radar sensors provide range and velocity measurements. Since the information is contained in the frequency of the chirp signal reflected by the target 111, the linearity of the chirp signal generated by the PLL is of high importance, especially in the fast chirp FMCW radars. Chirp nonlinearities can degrade the target resolution and accuracy of the radar measurements.

Figure 3:
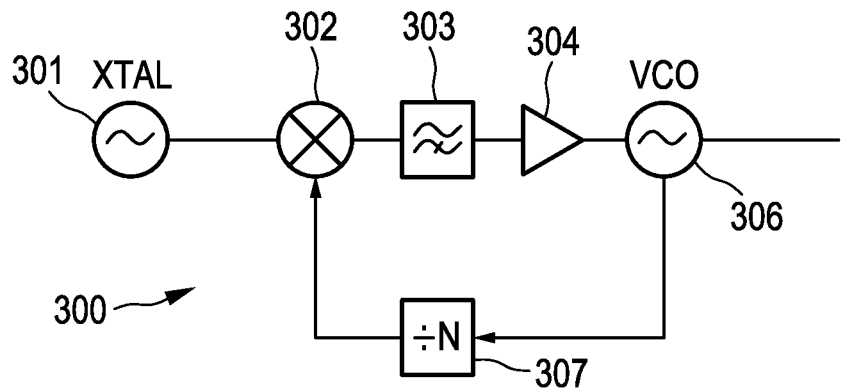
FIG. 3 a schematic block diagram of a phase locked loop (PLL) circuit.

FIG. 3 shows a schematic block diagram of a conventional PLL circuit 300 including a crystal oscillator 301, phase detector 302, loop filter 303 and amplifier 304, voltage controlled oscillator 306 and frequency divider 307. The PLL 300 is capable of providing a wide range of frequencies needed for example in chirp generators. In the crystal oscillator 301 a reference signal is generated and provided to the phase detector 302. In a situation when the reference signal is in phase with a frequency divided signal provided from the frequency divider 307, then the phase detector 302 outputs a constant control voltage signal that is filtered in the loop filter 303 and amplified in the amplifier 304. In consequence, the voltage controlled oscillator 306 oscillates at a stable frequency, which is higher by a factor N than the reference frequency of the crystal, wherein N corresponds to the number N applied as divisor in the frequency divider 307. Hence, in the closed loop of the PLL 300 the output frequency of the voltage controlled oscillator is locked to a certain oscillating frequency, which is a product of the frequency division factor N of the frequency divider 307 and a constant reference frequency of the crystal oscillator 301. If the phase detector 302 detects a phase deviation between the reference signal and the frequency divided signal, it outputs an error signal that drives the voltage controlled oscillator 306 such that the phase deviation, also called phase error, vanishes.

Figure 1:
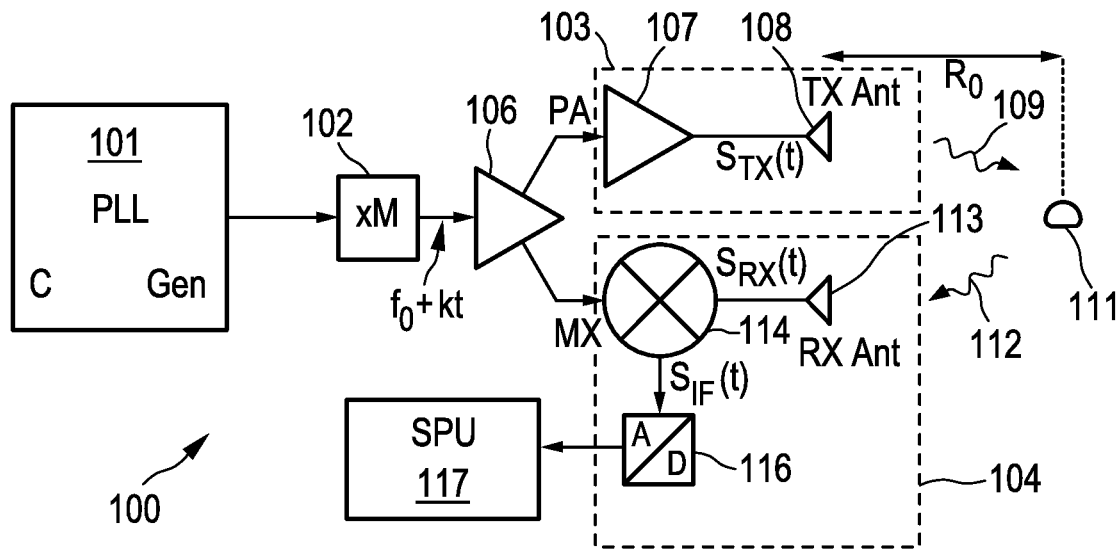
FIG. 1 a schematic block diagram of a conventional frequency modulated continuous wave (FMCW) radar system.

The phase detector 302 generates transient noise at its frequency of operation. The noise is superimposed on the control voltage signal to the voltage controlled oscillator 306 and modulates the output of the voltage controlled oscillator. Apparently, this noise has a negative impact on the measurement accuracy of the radar sensor 100 shown in FIG. 1 because information about range and velocity of the target 111 is extracted by comparing the frequencies of the transmit and the receive signal 109, 112, respectively.

Figure 4:
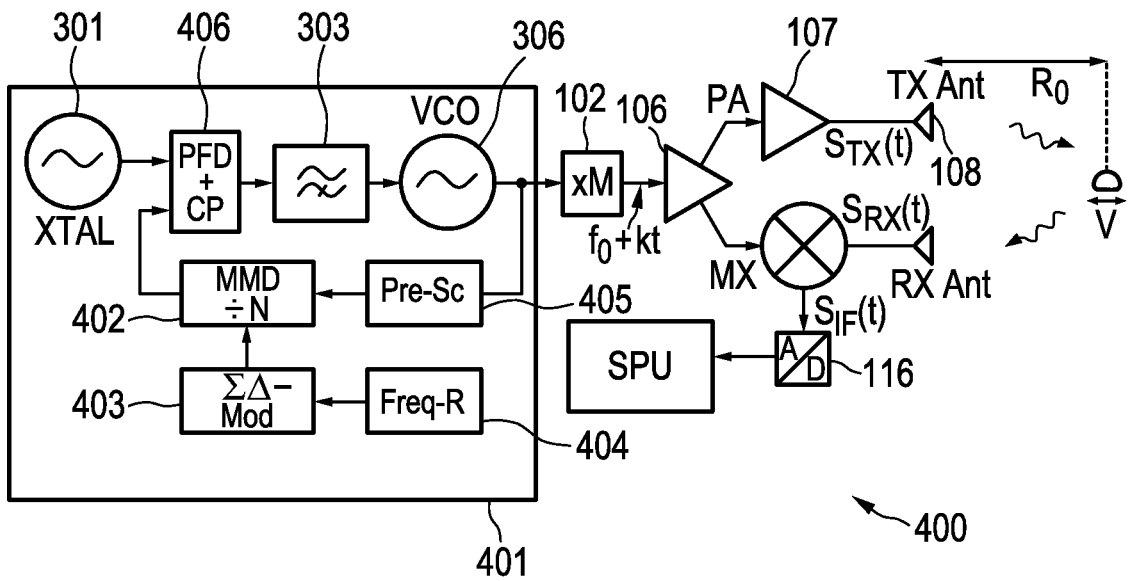
FIG. 4 a schematic block diagram of a radar sensor provided with a fractional-N PLL.

FIG. 4 shows a radar sensor 400 that is provided with a fractional-N PLL 401. A fractional-N PLL enables a fractional frequency division factor and at the same time allows the phase frequency detector to run at a high operating frequency for achieving reduced noise levels. This is accomplished by adding internal circuitry that enables the value of N to change dynamically during the locked state. That is the value of the divider is switched for example between five division factors, namely N−2, N−1, N, N+1 and N+2. Dividing by different division factors in an irregular manner reduces the quantization noise of the delta sigma modulator 403. By this kind of oversampling noise shaping is achieved. The noise is shifted to higher frequencies and filtered out by the loop filter 303 of the PLL.

In other embodiments MMDs 402 with fewer or more division factors are applied.

The fractional-N PLL 401 of the radar sensor 400 shown in FIG. 4 is implemented using a multi-modulus divider (MMD) 402 as well as a delta sigma modulator (DSM) 403 in combination with a frequency ramper 404. The frequency division ratio of the multi-modulus divider 402 is changed rapidly between integers by means of the delta sigma modulator so that the frequency division ratio can be a fractional number. In one embodiment the MMD 402 utilizes five different division factors. In other embodiments the MMD 402 may use fewer or more than five division factors. The frequency ramper 404 sweeps the frequency division ratio linearly to generate the linear frequency sweep (chirp) for the FMCW radar sensor 400. A pre-scaler 405 divides the frequency of the output signal of the voltage controlled oscillator 306 by a selected factor. The factor lies e.g. in the range from 16 to 128. Other components of the FMCW radar sensor 400 are the same as already described in connection with FIGS. 1 and 3 and are labelled with corresponding reference numbers.

In a practical example the voltage controlled oscillator 306 outputs a signal with a frequency of 39.5 GHz. The pre-scaler divides the 39.5 GHZ frequency by a factor of 16. The output signal of the pre-scaler 405 is provided to the MMD 402 and has a frequency of 2.46875 GHz. The crystal oscillator 301 outputs a signal having a frequency of 100 MHz. Consequently, the MMD 402 needs to realize a fractional division factor of 24.6875 on average by applying integer division factors for instance in the range of 22 to 26. This concept reduces quantization noise of the DSM 403 and improves the linearity of the frequency sweep.

Figure 5:
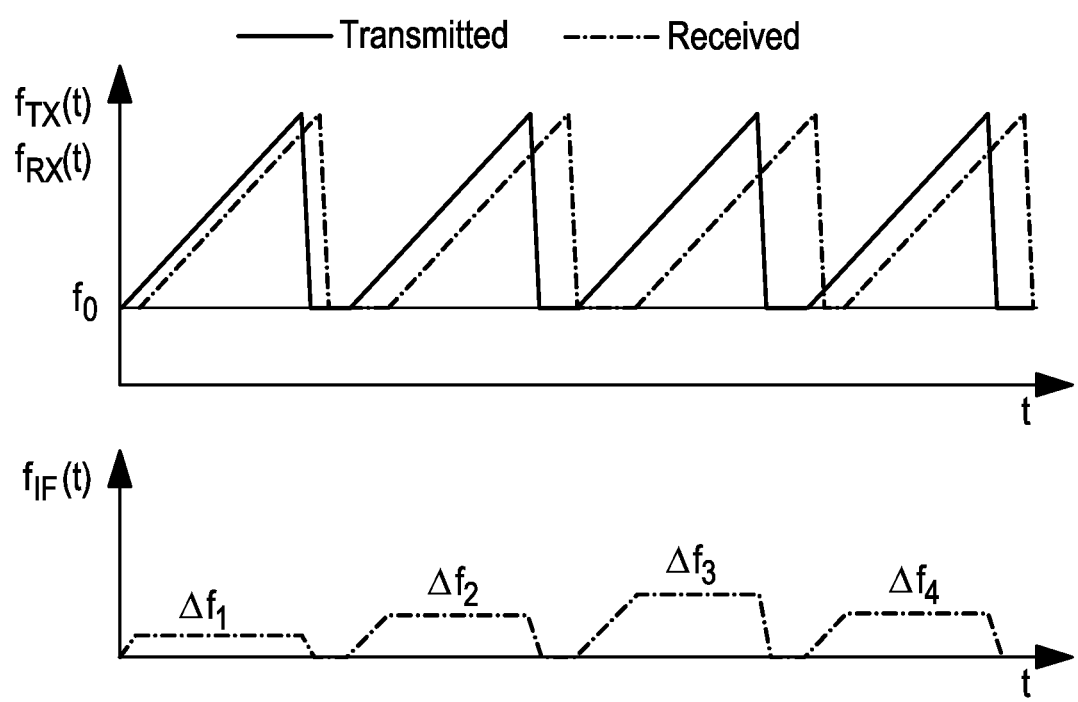
FIG. 5 a frequency diagram of the radar sensor of FIG. 4.

FIG. 5 shows in the upper diagram the frequency course of the transmit and receive chirp signals of the radar sensor 400 of four frequency sweeps. In the lower diagram FIG. 5 displays the variation of frequency differences of the transmit and receive signals of the four frequency sweeps. The frequency differences $\Delta f_1, \ldots, \Delta f_4$ are caused by the movement of the target 111 and, thus, allow detecting the range and the velocity of the target 111 by applying the physics of the Doppler effect.

Due to nonlinear tuning characteristic of the voltage controlled oscillator 306 the generation of a fast chirp will result in large phase errors. The magnitude of the phase error is determined by the rate of phase correction of a phase frequency detector (PFD) 406A and charge pump (CP) 406B, briefly named as PFD&CP 406 and shown in FIG. 6A. In consequence, a higher operating frequency of the PFD&CP 406 would reduce the magnitude of the phase error which is desirable.

However, there is a limit of the operating frequency of the PFD&CP 406 which will be explained in connection with FIGS. 6A and 6B.

Figure 6A:
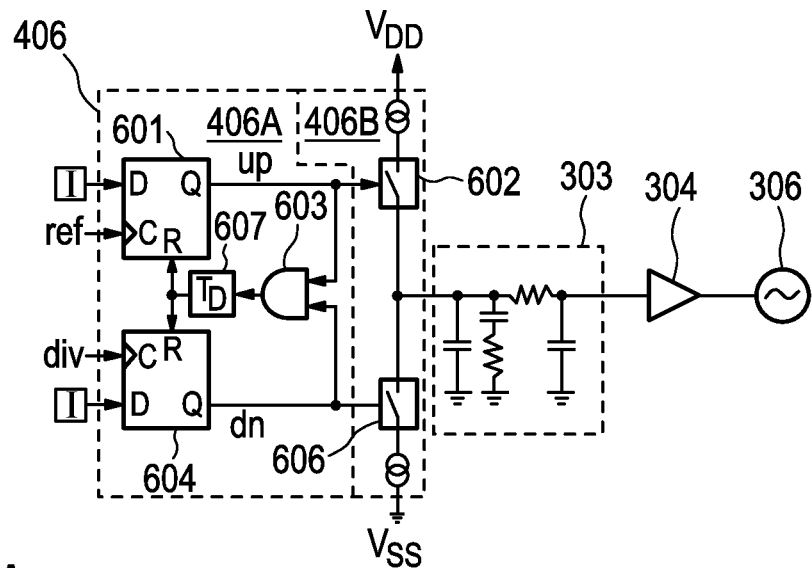
FIG. 6A a schematic block diagram of an exemplary phase frequency detector and charge pump.

FIG. 6A shows an exemplary block diagram of a PFD&CP 406. The PFD&CP 406 comprises a first flip-flop 601 receiving a reference signal ref from the crystal oscillator 301 (not shown in FIG. 6A). The output of the flip-flop 601 switches a charge pump 602 on and off. The charge pump 602 is connected with a positive supply voltage $V_{DD}$. The output of the flip-flop 601 is also provided to an AND gate 603. The PFD&CP 406 further includes a second flip-flop 604 receiving the divider signal div provided by the multi-modulus divider 402 as a clock signal. The output of the flip-flop 604 switches a charge pump 606 on and off. The charge pump 606 is connected with a negative supply voltage $V_{SS}$. The output of the flip-flop 604 is also provided to the AND gate 603. The outputs of the charge pumps 602 and 606 are connected with the input of the loop filter 303. The output of the AND gate 603 is connected with a delay element 607, the output of which provides a reset signal to the flip-flops 601 and 604. The delay element 607 delays a signal by a time duration $T_D$.

The operation of PFD&CP 406 will be explained in connection with the timing diagram shown in FIG. 6B. The flip-flop 601 is triggered by a rising edge of the reference signal ref and switches charge pump 602 on to control the charge of loop filter 303, which defines the control voltage signal for the voltage controlled oscillator 306. The charge pump 602 is connected with a positive supply voltage $V_{DD}$ and, thus, the operation of charge pump 602 increases the control voltage for the voltage controlled oscillator 306.

The rising edge of the divider signal div triggers the flip-flop 604 which switches on the charge pump 606 that is connected with the negative supply voltage $V_{SS}$. Hence, the operation of charge pump 606 decreases the control voltage for the voltage controlled oscillator 306.

The PFD 406A compares the rising edges of the reference signal (ret) with the divider signal (div) and generates corresponding up and dn signals to switch on and off the pull up and the pull down currents of the charge pumps 602 and 606. When both charge pumps 602 and 606 are switched on, the output of AND gate 603 goes high and resets the flip-flops 601 and 604. Due to the delay in the logic of the PFD 406A and a slew rate of the switches of the charge pumps 602, 604, the PLL 401 cannot respond to a very small phase difference between the reference signal ref and the divider signal div at the input of PFD 406A. This problem is also known as "dead zone". This will be explained in greater detail with reference to FIG. 6B.

Figure 6B:
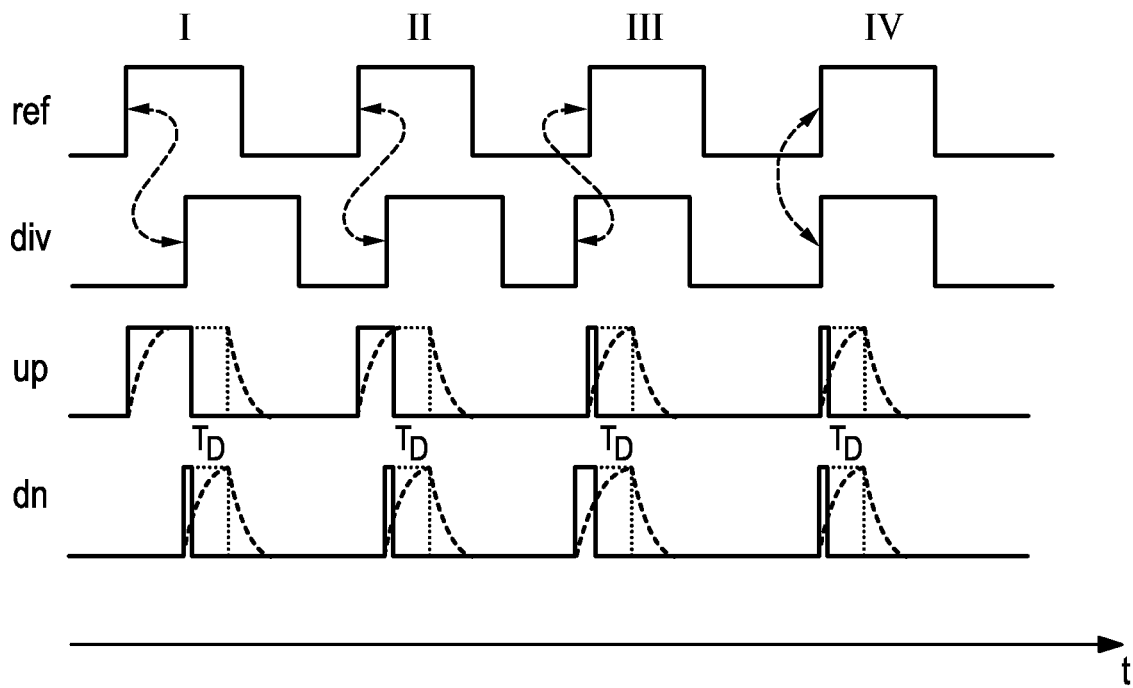
FIG. 6B a timing diagram of the signals processed in the phase frequency detector and charge pump shown in FIG. 6A.

FIG. 6B shows the timing diagram of the reference signal ref, the divider signal div, the switch signal up for charge pump 602 and the switch signal dn for charge pump 606. For each signal four pulses I to IV are shown in FIG. 6B. The corresponding pulses I to IV of the reference signal ref and the divider signal div have varying phase differences, i.e. the corresponding rising edges have different distances on the time axis.

At first, pulse group I is considered. The rising edge of reference signal ref triggers the flip-flop 601 which generates the switch signal up for the charge pump 602. The rising edge of dividers signal div triggers flip-flop 604 which generates the switch signal dn for charge pump 606. At the same time the AND gate 603 outputs the reset signal for both flip-flops 601 and 604. The pulse diagram for the switch signals up and dn shown in straight lines ignore the presence of the delay element 607. The influence of the delay element 607 will be explained further below.

In the pulse group II the rising edge of reference signal ref is still ahead of the rising edge of the divider signal div but the phase difference is different than for the pulse group I.

In pulse group III the rising edge of the divider signal div precedes the rising edge of the reference signal ref. In consequence, the charge pump 606 is switched on prior to the charge pump 602 before both flip-flops 601 and 604 are reset by the output of the AND gate 603.

In the pulse group IV the phase and differences between the reference signal ref and the divider signal div are very small and thus the switch signals up and dn are degraded to spikes, which have no effect on the voltage controlled oscillator 306 because of the slew rates of the charge pumps 602 and 606. However, if the reset signal generated by the and gate 603 is delayed by the delay element 607 then the switch signals up and dn have a minimum width. The influence of the delay element 607 on the switch signals up and dn is shown in FIG. 6B in dashed lines. Obviously, the delay element 607 makes sure that switch signals up and dn have a minimum pulse width. A realistic pulse shape is shown in dotted lines in FIG. 6B. In this way it is possible to correct also small phase differences in two steps, namely by adapting the control voltage for the voltage controlled oscillator 306 by a first amount in one direction and then changing it back by an almost similar amount.

The price for this improvement that has to be paid for is a limitation of the maximum operational frequency fop_max of the PFD 406A which is limited to $$Fop\_max = 1/T_D \qquad \text{(Eq. 4)}$$

Apparently, the falling edges have no impact on the operation of the PFD&CP 406. Consequently, the operation is also essentially independent of the duty cycle of the divider signal div.

This maximum operational frequency fop_max sets the limit to how fast the PFD 406A can compensate for phase and frequency errors and thus limits the precision of the control of the voltage controlled oscillator 306. That means a higher maximum operational frequency fop_max permits a higher precision in the control of the chirp signal which brings about a higher precision of the range and velocity detection of the radar system.

Figure 7A:
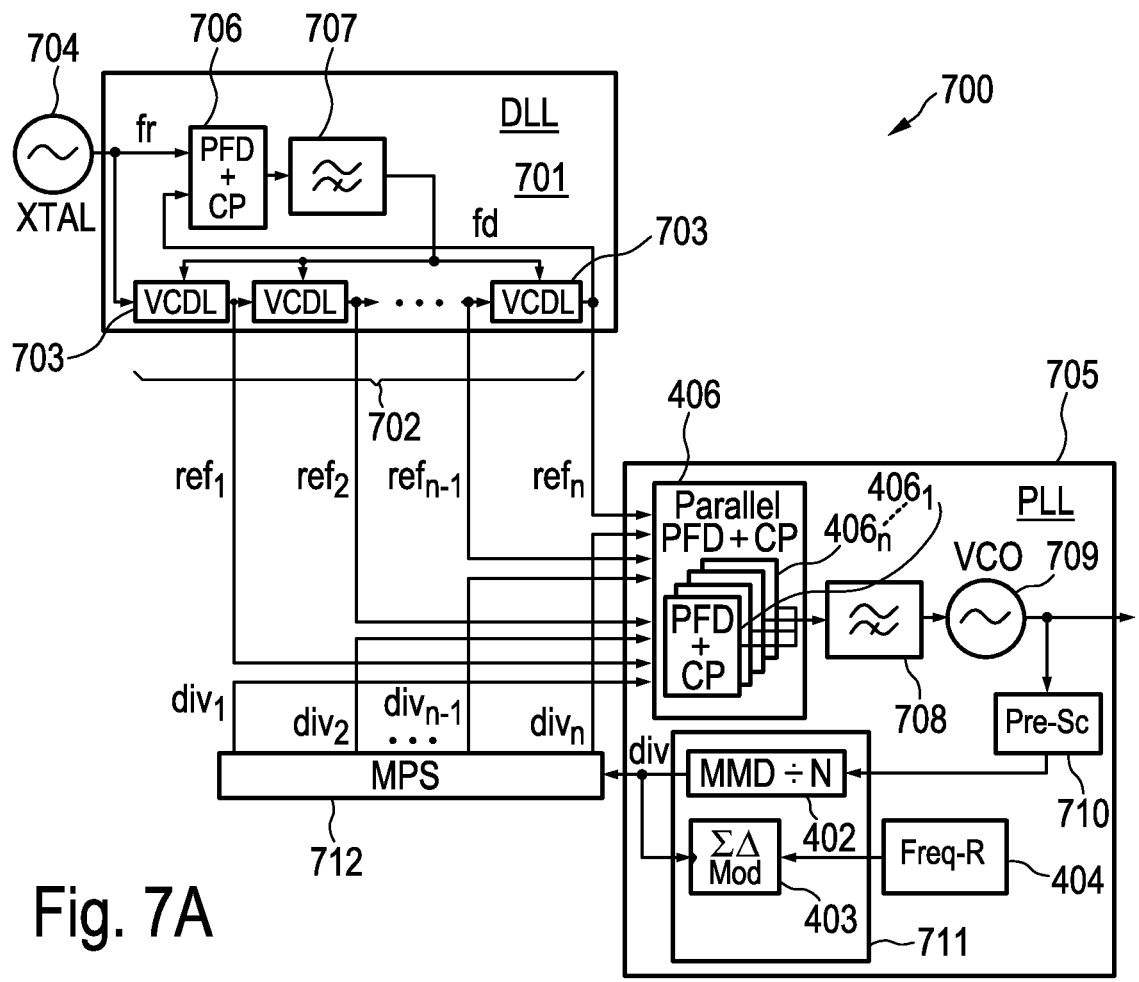
FIG. 7A a schematic block diagram of a first embodiment of a PLL circuit according to the present disclosure.

According to an embodiment of the present disclosure a novel PLL architecture is suggested that can be used for very fast chirp FMCW radar sensors and systems. FIG. 7A shows a schematic block-diagram of a proposed parallel fractional-N PLL 700. Instead of further increasing the operating frequency of the PFD&CP 406 as suggested above with reference to FIG. 5, several PFDs&CPs 406 are put in parallel and operated with individual reference signals $ref_1, \ldots, ref_n$, wherein n is a natural number equal to the number of parallel PFDs&CPs 406. Hence, for n, n≥1 applies. The reference signals $ref_1, \ldots, ref_n$ are generated by using a delay-locked loop (DLL) 701 to achieve a desired performance improvement of the radar system.

The DLL 701 comprises a variable delay chain 702, which is formed by a chain of individual elementary delay lines 703 with a certain delay time. The delay time is adjustable by a control voltage. The delay chain 702 delays a reference signal fr generated by a crystal oscillator 704. The reference signal fr represents a first input signal for a PFD&CP 706. The instantaneous delay of the entire chain 702 depends on the phase position between reference signal fr and an output signal fd that corresponds to the reference signal $ref_n$. The delay of the entire chain 702 is set dynamically during operation of the DLL 701 via a control voltage generated by a loop filter 707. The time delayed signal at the output of delay line is used as a second input signal fd for the PFD&CP 706.

The DLL 701 utilizes the reference signal ref of the crystal oscillator 704 as an input signal and generates multiple reference signals $ref_1, \ldots, ref_n$ with rising edges that are evenly spaced within a period of the input signal. Here and in the following n stands again for a positive integer number.

The parallel fractional-N PLL 700 also comprises a parallel PLL 705 including n parallel PFDs&CPs $406_1, \ldots, 406_n$. The entirety of all parallel PFDs&CPs $406_1, \ldots, 406_n$ is referred to with the reference number 406. The output signals of the n parallel PFDs&CPs $406_1, \ldots, 406_n$ are summed up and provided to a loop filter 708 generating a voltage control signal for a voltage controlled oscillator 709. A pre-scaler 710 receives the output of the voltage controlled oscillator 709 and outputs a lower frequency signal to the multi-modulus divider 402, which is controlled by the delta-sigma modulator 403. The multi-modulus divider 402 and the delta-sigma modulator 403 form a fractional-N divider 711. The signal div of the multi-modulus divider (MMD) 402 is fed to a multi-phase splitter (MPS) 712, which outputs multiple divider signals dive with different phases, wherein the number n of divider signals is equal to the number n of reference signals. Thus, each reference signal $ref_i$ is associated with a corresponding divider signal $div_i$, wherein i=1, . . . , n. The fractional-N divider 711 and the multi-phase splitter 712 form generator means for generating the multiple divider signals $div_1, \ldots, div_n$.

Figure 7B:
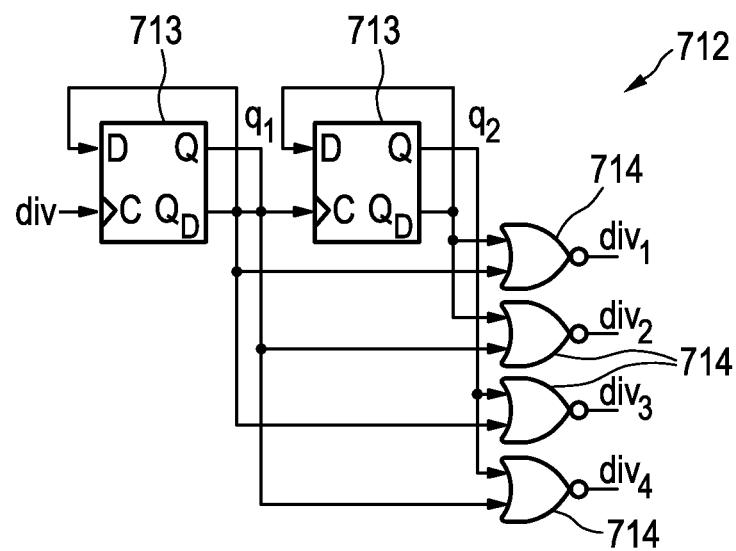
FIG. 7B a schematic block diagram of a multi-phase splitter (MPS)

FIG. 7B shows an example of the multi-phase splitter (MPS) 712 that outputs four divider signals $div_1, \ldots, div_4$. It makes use of two D-Flip-Flops 713 and four NOR gates 714 to generate four output signals $div_1, \ldots, div_4$ with four different phases at one fourth of the input frequency of the signal div provided by the multi-modulus divider 402. This specific example can be applied to the general architecture of a parallel PLL 700 shown in FIG. 7A. In this case the PLL 700 would work with four reference signals $ref_1, \ldots, ref_4$ and four divider signals $div_1, \ldots, div_4$. The divider signals $div_1, \ldots, div_4$ are then compared with the reference signals $ref_1, \ldots, ref_4$ of the DLL 701 in the parallel PFD&CP 406 of the PLL 700 shown in FIG. 7A. The concept of the parallel PFDs&CPs 406 is described in more detail with reference to FIG. 8.

Figure 8:
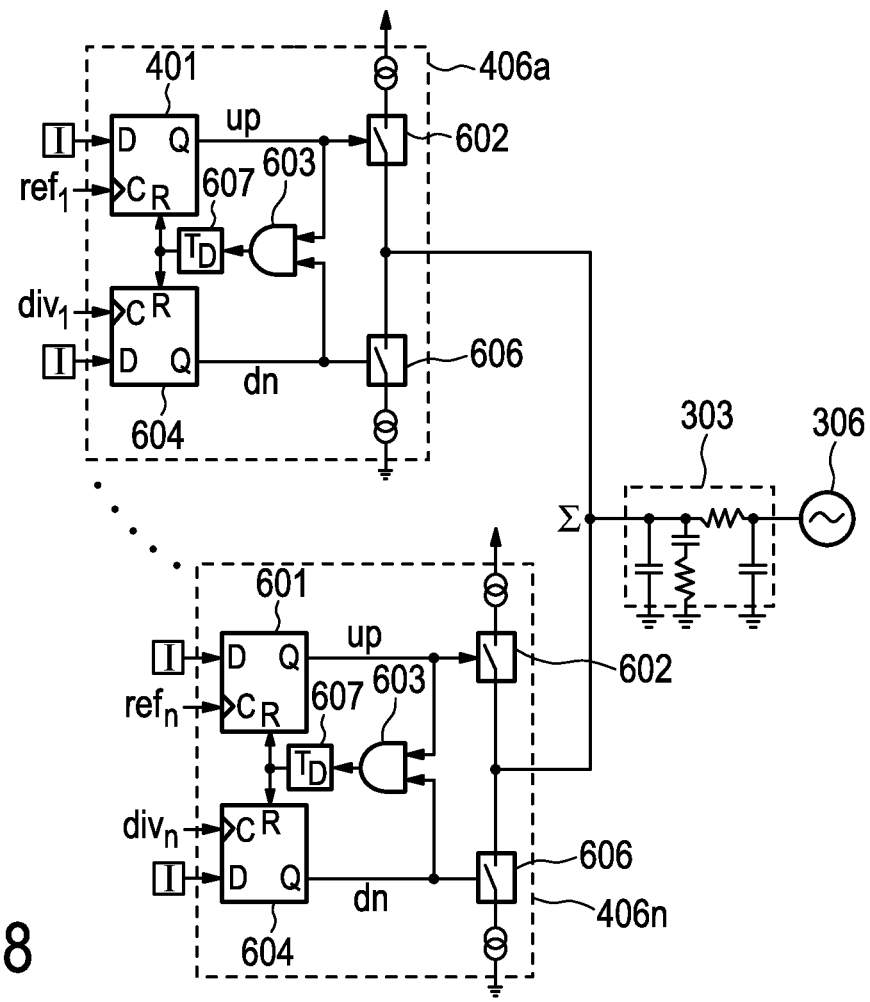
FIG. 8 a detailed schematic block diagram of the parallel PFDs&CPs included in the PLL circuit shown in FIG. 7A.

FIG. 8 shows a block diagram of the parallel PFDs&CPs $406_1$-$406_n$. The outputs of the PFDs&CPs $406_1$-$406_n$ are connected together at a node labelled with E to sum up the output currents of the plurality of charge pumps of the PFDs&CPs $406_1$-$406_n$ without using additional circuitry. The circuit structure of each one of the parallel PFDs&CPs $406_1$-$406_n$ is identical to the PFD&CP 406 shown in FIG. 6A. The summed up signal is transferred to the loop filter 303 which supplies the voltage controlled oscillator 306 with a control voltage signal.

The concept of parallel PFDs&CPs $406_1$-$406_n$ is not limited to a particular number, though practical limits may exist. However, for the sake of simplicity the functioning of the parallel PFDs&CPs $406_1$-$406_n$ will be explained with reference to an embodiment comprising four parallel PFD&CPs $406_1$-$406_4$.

Figure 9:
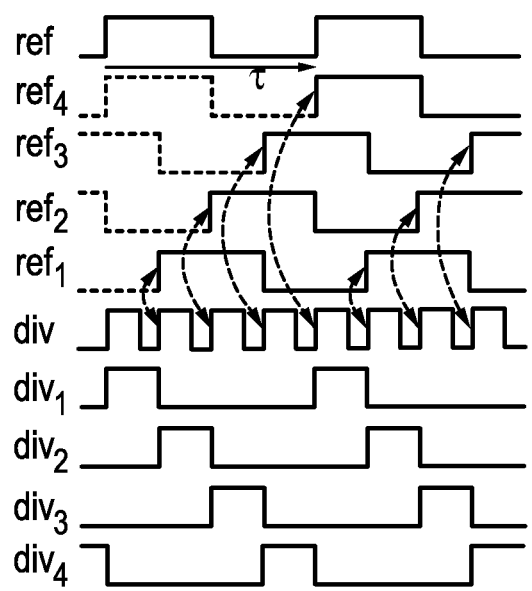

FIG. 9 shows a timing diagram of the parallel PLL 700 consisting of a DLL 701 with a delay chain 702 comprising four voltage controlled delay lines (VCDLs) 703, a multi-phase splitter 712 with four outputs, and four PFDs&CPs $406_1$-$406_4$ in parallel. The DLL 700 utilizes four VCDLs 703 to lock the delay of the input signal ref to its full period. Since the VCDLs 703 are matched to one another, they also create four output signals $ref_1$-$ref_4$ with rising edges that are evenly spaced within a period of the input signal. These four output signals $ref_1$-$ref_4$ are used as reference signals for the parallel PFDs&CPs $406_1$-$406_4$. On the feedback side, the high frequency divider signal div of the MMD 402 is fed to the multi-phase splitter 712 which outputs four low frequency divider signals $div_1$-$div_4$ with different phases. The multi-phase splitter 712 ensures that every rising edge of the high frequency divider signal div is represented in one of the divider signals $div_1$-$div_4$. The rising edges of the output signals $div_1$-$div_4$ are time shifted to one another by a quarter of a period t of the reference signal ref. The output signals $div_1$-$div_4$ are compared with the reference signals $ref_1$-$ref_4$ in the parallel PFDs&CPs $406_1$-$406_4$. As a result, phase and/or frequency differences between the reference signal ref generated by the crystal oscillator and the chirp signal generated by the voltage controlled oscillator 709 are detected four times during one period of the reference signal ref. Nevertheless, each individual PFD&CP $406_1$-$406_4$ is operated with a much smaller operation frequency than the output frequency of the fractional-N frequency divider 711. Or said in a different way: At a given operation frequency the parallel PFDs&CPs $406_1$-$406_4$ detect frequency and/or phase differences between the reference signal ref and the multi-modulus divider 402 four times faster than a single PFD&CPs 406 could do. In one embodiment the given frequency is the maximum operational frequency Fop_max of the PFD&CPs $406_1$-$406_4$ determined by the delay element 603, namely Fop_max=$1/T_D$ as defined in Equation (4).

The DSM 403 needs to be operated with a clock frequency that equals the number of the PFDs&CPs times the operating frequency of the PFDs&CPs because the output signal div of the multi-modulus divider 402 is split up into n divider signals having a frequency that is n-times lower than the frequency of the output signal div of the multi-modulus divider 402. This relationship among the signals is illustrated in the lower part of the timing diagram shown in FIG. 9.

The clock frequency of the reference signal ref from the crystal oscillator 704 is too low to serve as ac clock signal for the DSM 403. In a first embodiment of the parallel PLL 700 shown in FIG. 7, the output signal of the MMD 402 is used as a clock signal for the DSM 403. Utilizing the output divider signal div directly or indirectly as a clock signal for the DSM 403 corresponds to a first type of parallel PLL 700.

Alternatively, the clock signal for the DSM 403 can be derived from the reference signal ref of the crystal oscillator 704. E.g. a frequency multiplier included in the DLL 701 can be used to multiply the reference signal ref frequency by the same factor that equals the number of the parallel PFDs & CPs 406. Using a derivative of the reference signal ref as clock signal for the DSM 403 corresponds to a second type of parallel PLL 700. According to this second type of parallel PLL 700 the clock signal for the DSM 403 is based on a very "clean" signal.

Figure 10:
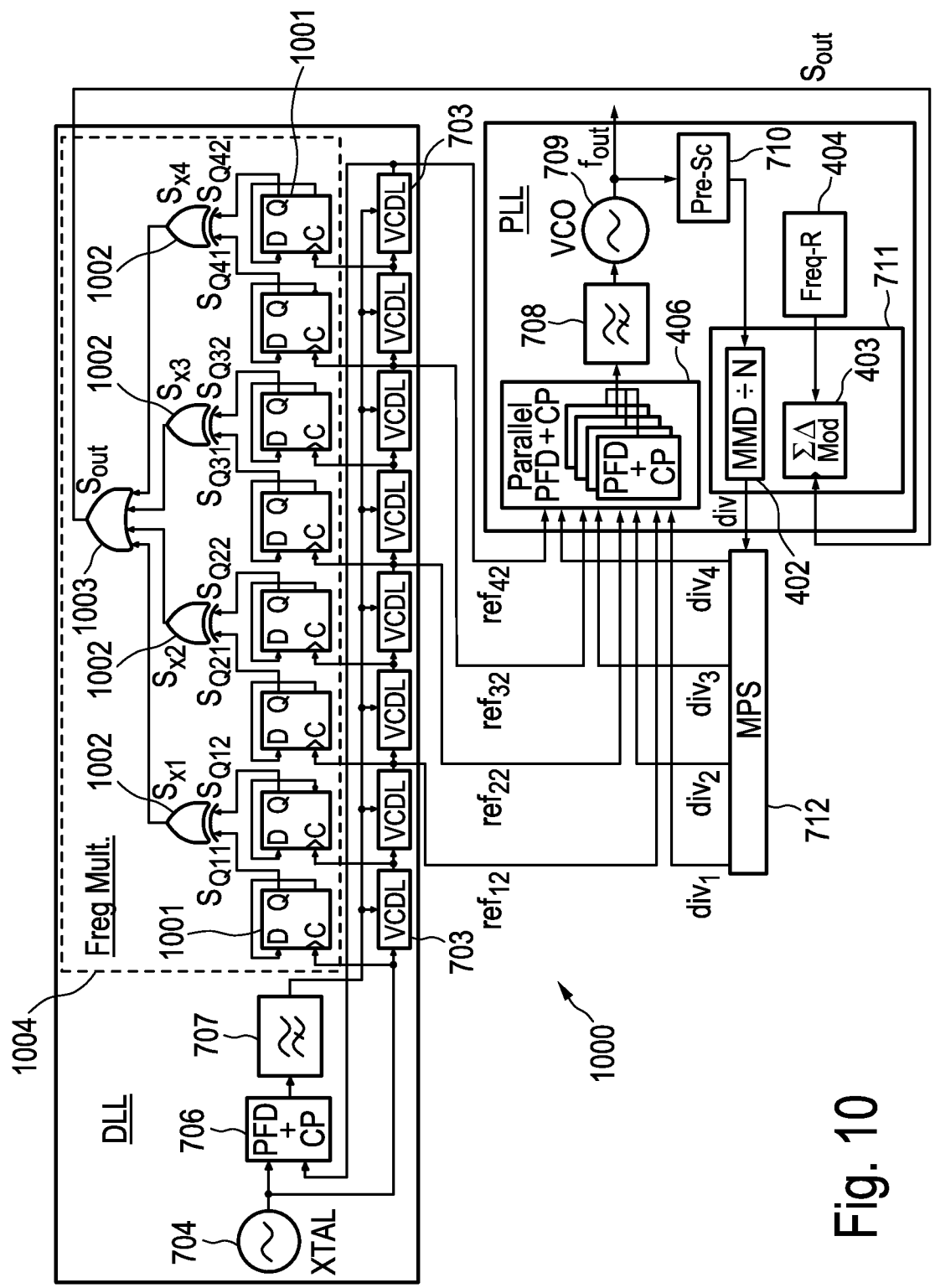
FIG. 10 a schematic block diagram of a second embodiment of a PLL circuit according to the present disclosure.

FIG. 10 shows an embodiment of the second type of parallel PLL 1000. In this embodiment the DLL 701 is used for both supplying reference signals $ref_{12}$, $ref_{22}$, $ref_{32}$, and $ref_{42}$ for the parallel PFDs&CPs 406 and for multiplying the reference signal frequency for generating a clock signal for the DSM 403. Specifically, the DLL 701 utilizes eight VCDLs 703 to lock the delay of the input signal to its full period. Logic gates including D-Flip-Flops 1001, XOR gates 1002 and OR gate 1003 form a frequency multiplier 1004 for generating an output signal Sow with a frequency that is four times higher than the frequency of the input signal received from the crystal oscillator 704. The output signal Soul is used as a clock signal for the DSM 403. The output signals of every second VCDLs 703 of the DLL 701 are used as reference signals $ref_{12}$, $ref_{22}$, $ref_{32}$ and $ref_{42}$ for the parallel PFDs&CPs 406, similar to the first type of the parallel PLL 700.

In both types of the PLL 700 (FIG. 7A) and 1000 (FIG. 10), the DSM 403 is clocked at a high frequency that equals the reference frequency times the number of PFDs&CPs 406 used in the parallel PLL. The DSM 403 is a digital building block that requires a large amount of logic gates. In most cases there are tight requirements with regard to the power consumption and chip area. Therefore, the DSM 403 is usually implemented by using CMOS logic gates, which are energy efficient and compact. However, the maximum operating frequency CMOS logic gates is much lower compared to current-mode logic gates. So the maximum number of PFDs&CPs 406 is limited by the maximum operating frequency of the DSM 403 in both types of the PLL 700 and 1000, respectively.

In order to overcome this limitation with regard to the number of the PFDs&CPs 406, the present disclosure suggests parallelizing the fractional-N divider 711 in the same way as the PFD&CP 406, wherein each fractional-N divider 711 includes one MMD 402 and one DSM 403. The number of parallel fractional-N dividers 711 corresponds to the number of parallel PFDs&CPs 406.

Figure 11:
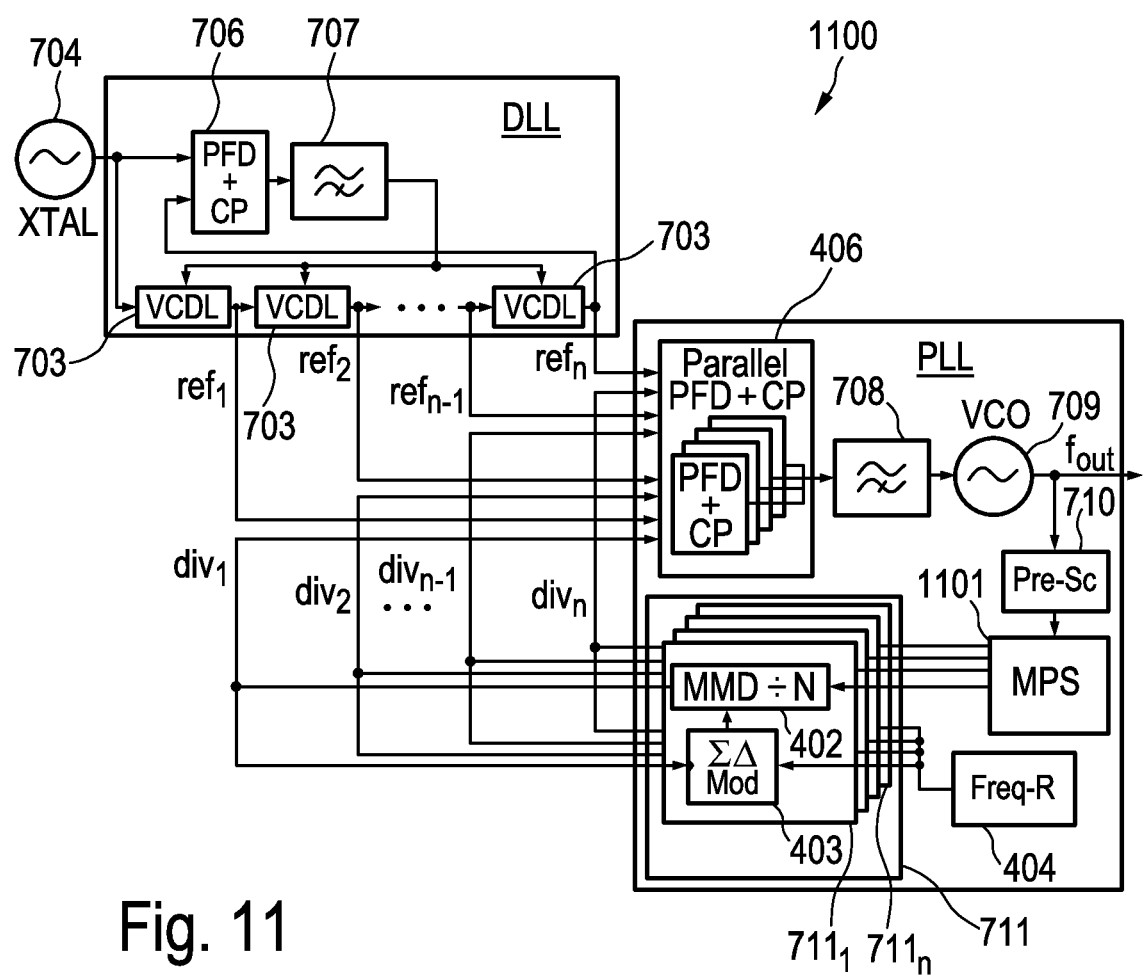
FIG. 11 a schematic block diagram of a third embodiment of a PLL circuit according to the present disclosure.

FIG. 11 shows a third embodiment of a parallel PLL 1100 including parallel fractional-N dividers $711_1$-$711_n$, which are referred to in their entirety with the reference number 711. A multi-phase splitter 1101 is connected to the output of the pre-scaler 710 and used to generate several input signals with different phases for each one of the parallel fractional-N dividers $711_1$-$711_n$. Thus, the parallel DSMs 403 in each the parallel fractional-N divider $711_1$-$711_n$ can be clocked with the same reference frequency. Therefore, in the embodiment shown in FIG. 11 the output signal $div_1$-$div_n$ of each one of the MMD 402 is used as clock signal for the associated DSM 403, wherein each pair of associated MMD 402 and DSM 403 form one of the parallel fractional-N dividers $711_1$-$711_n$. The output signals of the parallel fractional-N dividers are fed directly to the parallel PFDs&CPs 406 without a multi-phase splitter because reference signals $ref_1$-$ref_n$ have the same frequency as the divider signals $div_1$-$div_n$. Since the divider signals $div_1$-$div_n$ are used as clock signals for the DSMs 403, PLL 1100 is of the first type of parallel PLLs.

Figure 12:
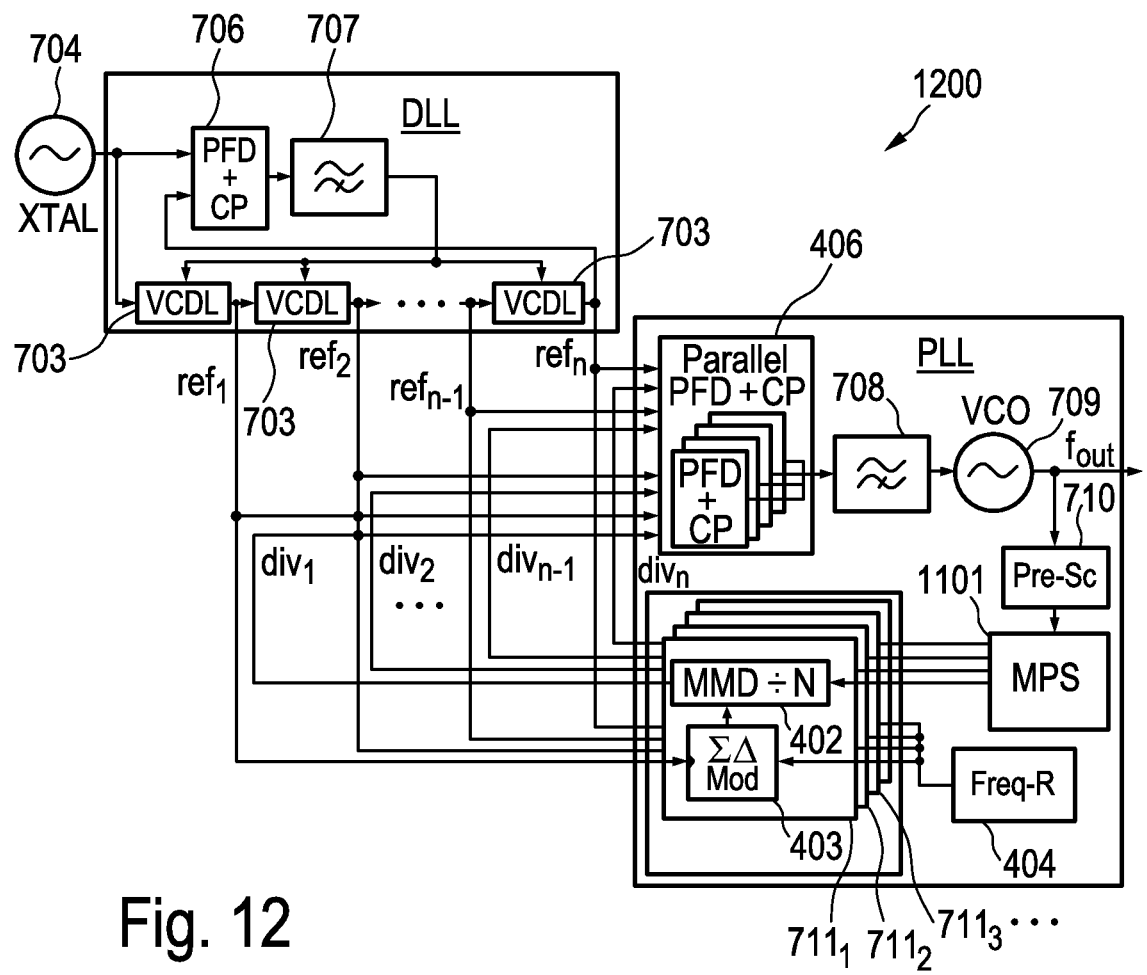
FIG. 12 a schematic block diagram of a fourth embodiment of a PLL circuit according to the present disclosure.

FIG. 12 shows a fourth embodiment of a parallel PLL 1200 that is similar to the PLL 1100. In contrast to the PLL 1100, in the PLL 1200 the output signals the VCDLs 703 are used as clock signals for the DSM 403. Since the output signals the VCDLs 703 are derivate signals of the reference signal of the crystal oscillator 704, the fourth embodiment falls into the group of the second type of parallel PLLs, such as PLL 1000.

In the embodiments shown in FIGS. 11 and 12 the multiple fractional-N dividers $711_1$-$711_n$ form generator means for generating the multiple divider signals $div_1, \ldots, div_n$.

Figure 13:
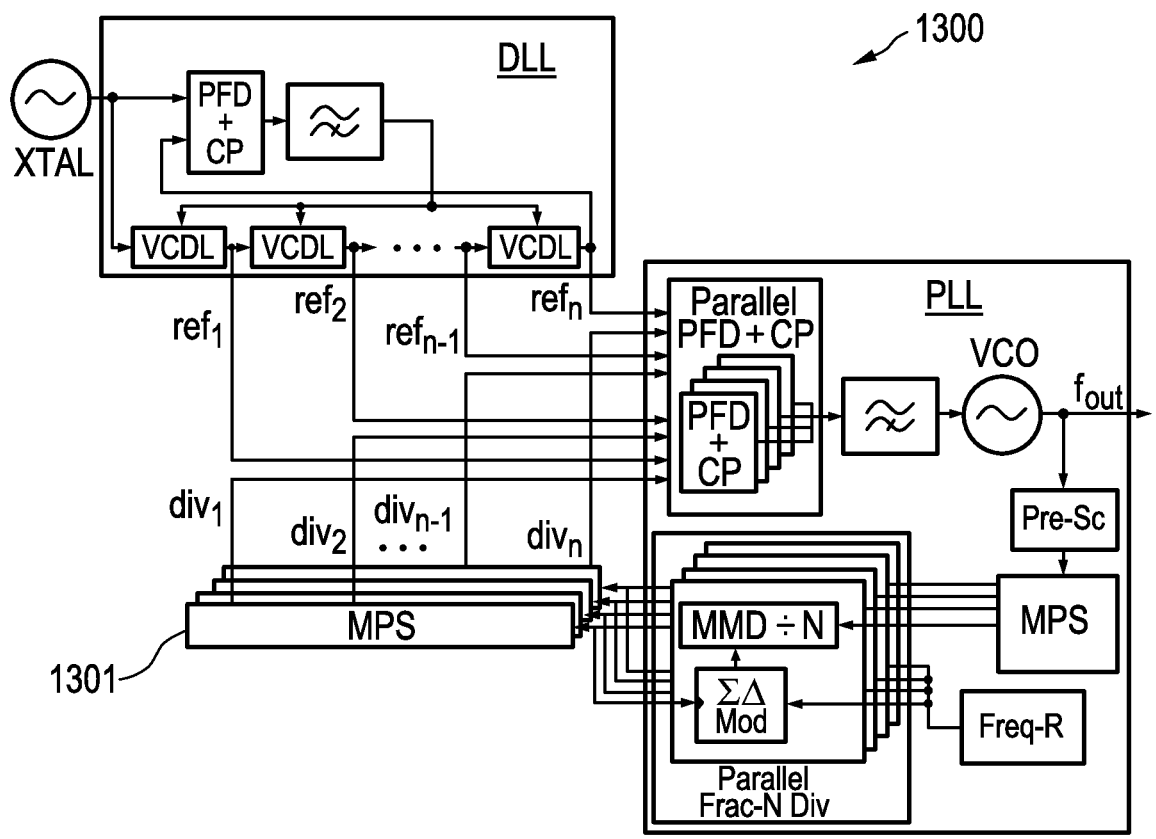
FIG. 13 a schematic block diagram of a fifth embodiment of a PLL circuit according to the present disclosure.

FIG. 13 shows a fifth embodiment of a parallel PLL 1300 with a reduced number of parallel fractional-N dividers 711. Although there is a practical limit on the maximum operating frequency of the DSM 403, the DSM 403 can still be operated with a higher clock frequency than the operating frequency of the PFD&CP 406. The number of the parallel fractional-N dividers 711 can be reduced slightly by employing parallel multi-phase splitters 1301 at the outputs of the parallel fractional-N dividers 711 and another multi-phase splitter 1101 at the output of the pre-scaler 710. In this way, the DSM 403 can still be operated with a frequency that is higher than the reference frequency but is lower than the reference frequency times the number of the parallel PFDs&CPs. The clock signals for the DSMs 403 are the divider output signals. Hence, the fifth embodiment belongs to the first type of parallel PLLs like the PLL 700. PLL 1300 employs the concepts of PLL 700 and PLL 1100.

Figure 14:
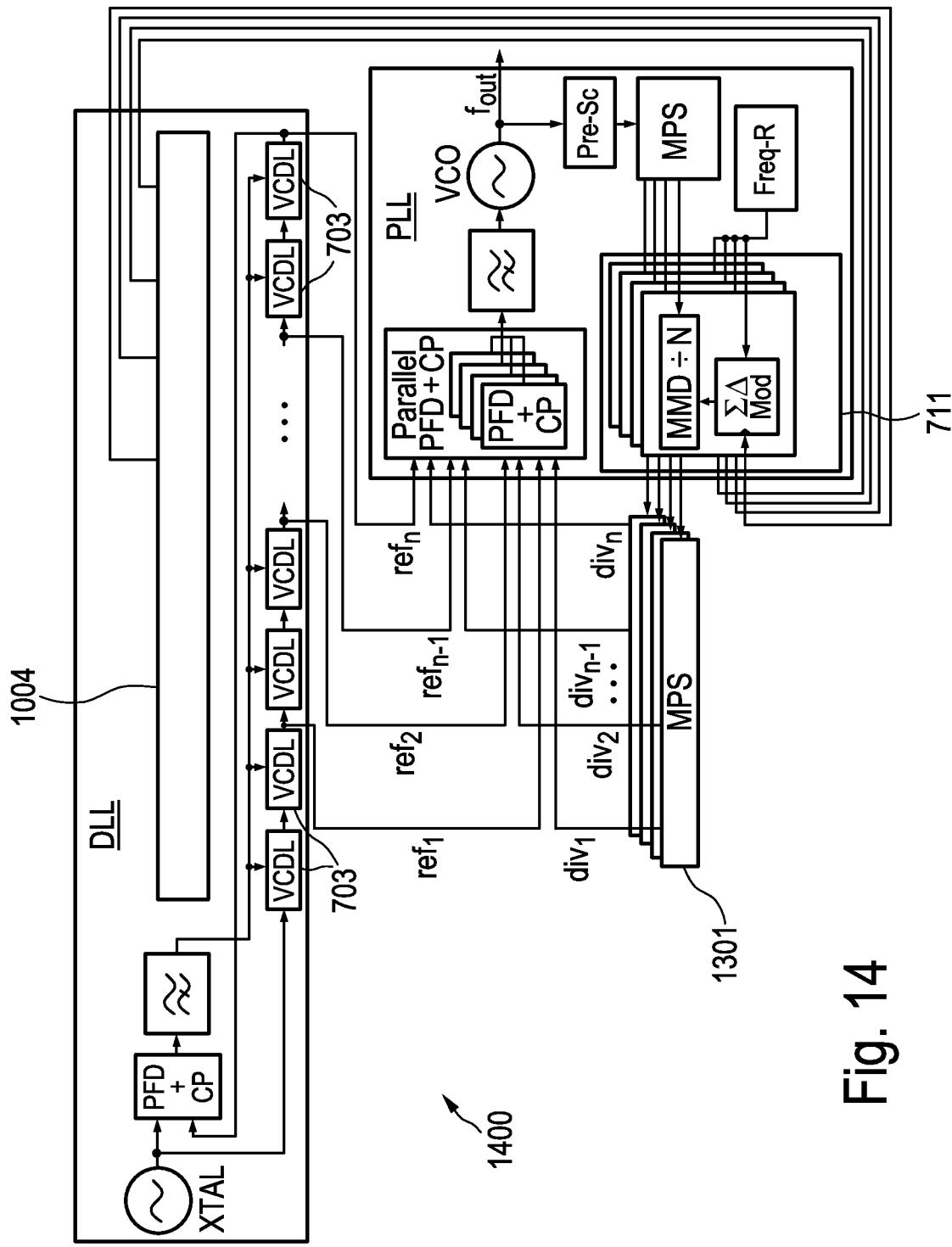
FIG. 14 a schematic block diagram of a sixth embodiment of a PLL circuit according to the present disclosure.

Finally, FIG. 14 shows a sixth embodiment of a parallel PLL 1400 that combines the concepts of PLL 1000 and PLL 1300. PLL 1400 comprises a reduced number of parallel fractional-N dividers 711. In contrast to PLL 1300, PLL 1400 utilizes DLL 701 with the frequency multiplier 1004 to generate the clock signals for the DSMs 403, similar to parallel PLL 1000. Consequently, PLL 1400 is of the second type of parallel PLL.

In the embodiments shown in FIGS. 13 and 14 the multiple fractional-N dividers 711 and the multiple multi-phase splitter 1301 form generator means for generating the multiple divider signals $div_1, \ldots div_n$.

Figure 15:
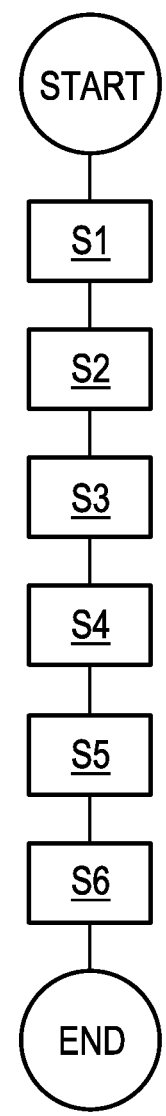
FIG. 15 a schematic flow diagram of a method for operating a PLL circuit according to the present disclosure.

FIG. 15 displays a flow diagram of a method for operating a parallel fractional-N phase locked loop (PLL) in accordance with the present disclosure. In a first step S1 n reference signals $ref_1$-$ref_n$ are provided that have the same frequency and are shifted among each other by a fixed phase difference, wherein n is a natural number. In a second step an output signal of a multi-modulus divider 402 is received.

In a third step S3 n divider signals $div_1$-$div_n$ are generated, that are shifted by an equal phase difference relative to one another, wherein their frequency is n-times smaller than the frequency of the output signal of the multi-modulus divider, and wherein the frequency of the n divider signals $div_1$-$div_n$ corresponds to the frequency of the output signal of the multi-modulus divider divided by n. In a forth step S4 each one of the reference signals $ref_1$-$ref_n$, and an associated divider signal $div_1$-$div_n$ are connected as a pair of input signals to one phase frequency detector (PFD) 406. In a fifth step S5 a loop filter 708 outputs an error signal if a frequency and/or phase difference is detected between the input signals. Finally, in a sixth step S6 all error signals are summed up in a node E to control a voltage controlled oscillator 709 such that a potentially existing frequency and/or phase difference between the pairs of input signals is reduced.

In other embodiments of the method for operating a parallel fractional-N phase locked loop (PLL) in accordance with the present disclosure the method steps may be performed in a different sequence.

The present disclosure suggests a novel parallel phase locked loop architecture solving the limitation of the maximum operating frequency of the fractional-N phase-locked loop (PLL) for fast-chirp FMCW radars. One basic idea is to put several PFDs&CPs in parallel and to operate them with reference signals that are generated by using a delay-locked loop (DLL) instead of further increasing the operating frequency of the PFD&CP. The proposed DLL supported parallel PLL architectures enable further speeding up the FMCW chirp as well as improving its linearity and the performance of Range Doppler Radars based on fast-chirp FMCW radar. As a summary, the novel parallel fractional-N PLL architectures result bring about the following advantages:

Elimination of the maximum operating frequency of the PFD&CP and the DSM.

Higher maximum radial unambiguous velocity for the range-Doppler fast chirp FMCW radar.

Improvement of the linearity of the FMCW chirp. As a consequence, the phase error can be reduced and the measurement accuracy of the radar is increased.

Improvement of phase noise performance of the PLL leading to reduced jitter. At the same time the measurement accuracy of the radar is also increased.

Simple high speed clock generation for the delta-sigma modulator of the fractional-N PLL.

Even though the present disclosure has been described with reference to a radar sensor or radar system, it can nevertheless equally well be applied in other apparatuses, too.

Individual components or functionalities of the present disclosure are described in the design examples as software or hardware solutions. However, this does not mean that a functionality described as a software solution cannot also be implemented in hardware and vice versa. Similarly, mixed solutions are also conceivable for a specialist, in which components and functionalities are partly implemented simultaneously in software and hardware.

In the claims, the word "comprise" and "include" do not exclude other elements or steps. The indefinite article does not exclude a majority of elements or components.

A single unit or device can perform the functions of several elements listed in the claims. The fact that individual functions and elements are listed in different dependent claims does not mean that a combination of these functions and elements could not also be used advantageously.

REFERENCE SIGNS LIST

| | |
|---|---|
| 100 | FMCW radar system |
| 101 | chirp generator |
| 102 | multiplier |
| 103 | transmitter |
| 104 | receiver |
| 106 | amplifier |
| 107 | power amplifier |
| 108 | transmit antenna |
| 109 | electromagnetic wave |
| 111 | target |
| 112 | electromagnetic wave |
| 113 | receive antenna |
| 114 | mixer |
| 116 | A/D converter |
| 300 | PLL |
| 301 | Crystal oscillator |
| 302 | phase detector |
| 303 | loop filter |
| 304 | amplifier |
| 306 | voltage controlled oscillator |
| 400 | FMCW radar system |
| 401 | fractional-N PLL |
| 402 | multi-modulus divider (MMD) |
| 403 | delta sigma modulator |
| 404 | frequency ramper |
| 405 | pre-scaler |
| 601 | flip-flop |
| 602 | charge pump |
| 603 | AND gate |
| 604 | flip-flop |
| 606 | charge pump |
| 607 | delay element |
| 700 | fractional-N PLL |
| 701 | DLL |
| 702 | Delay Chain |
| 703 | Voltage controlled Delay line |
| 704 | Crystal oscillator |
| 706 | PFD&CP |
| 707 | loop filter |
| 708 | loop filter |
| 709 | voltage controlled oscillator |
| 710 | pre-scaler |
| 711 | fractional-N divider |
| 712 | multi-phase splitter |
| 713 | D-flip-flops |
| 714 | NOR gates |
| 1000 | PLL |
| 1001 | D flip-flops |
| 1002 | XOR gate |
| 1003 | OR gate |
| 1004 | multiplier |
| 1100 | PLL |
| 1101 | multi-phase splitter |
| 1200 | PLL |
| 1300 | PLL |
| 1301 | multi-phase splitter |
| 1400 | PLL |
| S1-S6 | method steps |

What is claimed is:

1. A phase locked loop circuit comprising a reference signal source and a voltage controlled oscillator for generating a phase and/or frequency controlled output signal, wherein a multi-modulus divider divides the output signal of the voltage controlled oscillator to generate a divider signal that is compared with a reference signal in a phase and/or frequency detector outputting an error signal that controls the voltage controlled oscillator, wherein the phase locked loop circuit comprises:

a delay locked loop as the reference signal source that provides n reference signals that have the same frequency and are shifted among each other by a fixed phase difference, wherein n is a natural number, generator means for generating one associated divider signal for each reference signal, n phase frequency detectors and charge pumps configured such that each one of the reference signals and its associated divider signal are connected as a pair of input signals to one phase frequency detector and charge pump outputting an error signal if a frequency and/or phase difference is detected between the input signals;

a node where all error signals generated by the phase frequency detectors and charge pumps are summed up to generate a control voltage signal for controlling the voltage-controlled oscillator, wherein the multi-modulus divider is operatively connected with an associated delta sigma modulator to form a fractional-N divider, and wherein the phase locked loop circuit comprises a plurality of multi-modulus dividers and associated delta sigma modulators to form parallel fractional-N dividers, wherein a multi-phase splitter receives the output signal of the voltage controlled oscillator or of the pre-scaler and outputs a plurality of phase shifted output signals to the plurality of fractional-N dividers such that each one of the plurality of fractional-N dividers receives one respective signal of the plurality of phase-shifted output signals.

2. The phase locked loop circuit according to claim 1, wherein the generator means includes a plurality of multi-phase splitters each receives the output signal of one of the multi-modulus dividers for generating n divider signals, that are shifted by an equal phase difference relative to one another, and wherein their frequency is n-times smaller than the frequency of the output signal of the plurality of multi-modulus dividers.

3. The phase locked loop circuit according to claim 1, wherein each output of the plurality of multi-modulus dividers is connected to one of the associated delta sigma modulators as a clock signal.

4. The phase locked loop circuit according to claim 1, wherein the phase locked loop circuit comprises a pre-scaler receiving the output of the voltage-controlled oscillator and outputting a lower frequency signal to the plurality of multi-modulus dividers.

5. The phase locked loop circuit according to claim 1, wherein the output signal of each multi-modulus divider is provided as a clock signal to its associated delta sigma modulator forming one of the fractional-N dividers.

6. The phase locked loop circuit according to claim 5, wherein each reference signal is provided as clock signal to one of the delta sigma modulators forming one of the fractional-N dividers.

7. The phase locked loop according to claim 1, wherein a frequency ramper controls the delta sigma modulators.

8. The phase locked loop according to claim 1, wherein the multi-phase splitter receives an input signal from the pre-scaler.

9. The phase locked loop according to claim 1, wherein the output of each one of the multi-modulus dividers is connected with a multi-phase splitter outputting a plurality of divider signals.

10. The phase locked loop circuit according to claim 1, wherein the delay locked loop includes a multiplier multiplying the reference signal by a factor n to generate a clock signal to be provided to each one of the delta sigma modulators of the parallel fractional-N dividers.

11. The phase locked loop circuit according to claim 1, further comprising a combination of parallel phase frequency detectors and charge pump, parallel fractional-N dividers, one or multiple multipliers for multiplying a reference signal, one or several multi-phase splitters connected with an output of a fractional-N divider and/or one or several multi-phase splitters providing an input to the one or several fractional-N dividers.

12. A radar sensor comprising a phase locked loop circuit according to claim 1.

13. A method for operating a phase locked loop, the method comprising providing n reference signals that have the same frequency and are shifted among each other by a fixed phase difference, wherein n is a natural number, receiving in a multiphase splitter an output signal of a voltage controlled oscillator or a pre-scaler;

generating in the multiphase splitter a plurality of phase shifted output signals;

outputting the plurality of phase shifted output signals to a plurality of fractional-N dividers, such that each one of the plurality of fractional-N dividers receives one respective signal of the plurality of phase shifted output signals from the multiphase splitter;

generating in the plurality of fractional-N dividers one associated divider signal for each reference signal;

connecting each one of the reference signals and the associated divider signal as a pair of input signals to one phase frequency detector and charge pump;

outputting an error signal if a frequency and/or phase difference is detected between the input signals; and summing up all error signals to control a voltage-controlled oscillator such that a potentially existing frequency and/or phase difference between the pairs of input signals is reduced.

\* \* \* \* \*